United States Patent
Yang et al.

(10) Patent No.: US 10,431,770 B2
(45) Date of Patent: Oct. 1, 2019

(54) OLED PANEL WITH A RING SHAPE RESIN ENCAPSULATION MATERIAL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhongguo Yang, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/753,799

(22) PCT Filed: Jan. 17, 2018

(86) PCT No.: PCT/CN2018/073042
§ 371 (c)(1),
(2) Date: Feb. 20, 2018

(87) PCT Pub. No.: WO2019/127702
PCT Pub. Date: Jul. 4, 2019

(65) Prior Publication Data
US 2019/0207151 A1    Jul. 4, 2019

(30) Foreign Application Priority Data

Dec. 29, 2017  (CN) .......................... 2017 1 1479105

(51) Int. Cl.
*H01L 29/08*      (2006.01)
*H01L 33/00*      (2010.01)
(Continued)

(52) U.S. Cl.
CPC ...... *H01L 51/5246* (2013.01); *H01L 51/0096* (2013.01); *H01L 51/5253* (2013.01);
(Continued)

(58) Field of Classification Search
CPC . H01L 51/0096; H01L 51/5253; H01L 51/56; H01L 51/524
See application file for complete search history.

(56) References Cited

U.S. PATENT DOCUMENTS

| 8,049,245 | B2* | 11/2011 | Song | .................... H01L 51/5253 257/100 |
| 2010/0013384 | A1* | 1/2010 | Song | .................... H01L 51/5246 313/504 |

(Continued)

FOREIGN PATENT DOCUMENTS

| CN | 103500755 | 1/2014 |
| CN | 203521480 | 4/2014 |

(Continued)

*Primary Examiner* — Alonzo Chambliss
(74) *Attorney, Agent, or Firm* — Hauptman Ham, LLP

(57) ABSTRACT

An OLED panel includes a substrate, a cover plate, an organic light-emitting layer arranged between the substrate and the cover plate, a water-blocking layer packing the organic light-emitting layer on a surface of the substrate, and a ring-like composite encapsulating material layer arranged between the substrate and the cover plate. The composite encapsulating material layer surrounds the water-blocking layer. The composite encapsulating material layer and the water-blocking layer are sealed between the substrate and the cover plate. The composite encapsulating material layer is made of a nano-resin material. A method for fabricating the OLED panel is also provided. The nano-resin material with better adhesion and toughness is used as a encapsulating material of the OLED panel to have compactness and properties of blocking water and oxygen, thereby replacing
(Continued)

a dam and a getter and realizing a narrow-bezel encapsulation for OLEDs with a large size.

9 Claims, 3 Drawing Sheets

(51) Int. Cl.
 *H01L 21/00* (2006.01)
 *H01L 51/52* (2006.01)
 *H01L 51/00* (2006.01)
 *H01L 51/56* (2006.01)
 *H01L 27/32* (2006.01)

(52) U.S. Cl.
 CPC .......... *H01L 51/56* (2013.01); *H01L 27/3244* (2013.01); *H01L 2251/301* (2013.01); *H01L 2251/303* (2013.01)

(56) References Cited

U.S. PATENT DOCUMENTS

| | | | | |
|---|---|---|---|---|
| 2010/0045181 | A1* | 2/2010 | Oh | H01L 33/005 313/512 |
| 2014/0217371 | A1* | 8/2014 | Kim | H01L 51/5256 257/40 |
| 2016/0035996 | A1* | 2/2016 | Sun | H01L 21/77 257/40 |
| 2016/0064695 | A1* | 3/2016 | Yoshihara | H01L 51/524 257/40 |
| 2019/0081272 | A1* | 3/2019 | Jung | H01L 51/5203 |

FOREIGN PATENT DOCUMENTS

| | | |
|---|---|---|
| CN | 104979373 | 10/2015 |
| CN | 105158990 | 12/2015 |
| CN | 105576147 | 5/2016 |
| WO | 2008027138 | 3/2008 |

* cited by examiner

OLED PANEL WITH A RING SHAPE RESIN ENCAPSULATION MATERIAL

RELATED APPLICATIONS

The present application is a National Phase of International Application Number PCT/CN2018/073042, filed Jan. 17, 2018, and claims the priority of China Application No. 201711479105.X, filed Dec. 29, 2017.

FIELD OF THE DISCLOSURE

The disclosure relates to a semiconductor encapsulation technical field, and more particularly to an OLED panel and a method for fabricating the same.

BACKGROUND

OLEDs feature self-illumination, high brightness, wide view angle, high contrast, flexibility, and low power consumption. Thus, OLEDs have attracted wide publicity. Owning to their display way, OLEDs have gradually replaced the conventional liquid crystal displays. OLEDs are widely applied to screens of mobile phones, displays of computers, and full-color televisions. The display technology of OLEDs is different from the display technology of LCDs. Instead of a backlight module, the display technology of OLEDs uses a very thin coating layer made of an organic material and a glass substrate. When a current flows through the organic material, the organic material will light up. Since an organic material easily reacts with water and oxygen, the demands of encapsulating OLED displays based on organic material are very strict. In order to commercialize OLED display panels, the related encapsulation technology is greatly researched.

The active electrodes and organic light-emitting materials of OLEDs are sensitive to water and oxygen. The invasion of water and oxygen can rapidly impair the display effect and the life of OLEDs. Since OLEDs with a large size needs a longer life, the OLED encapsulation requires a dam and a getter. Since the dam and the getter are wider, the encapsulation has a larger bezel, which results in larger affection on the appearance of products. Thus, it is necessary to develop new encapsulation technology to realize a narrow-bezel encapsulation for OLEDs with a large size.

SUMMARY

A technical problem to be solved by the disclosure is to provide an OLED panel and a method for fabricating the same, which uses the nano light-curing resin to replace a dam and a getter, thereby guaranteeing encapsulation properties and realizing a narrow-bezel encapsulation for OLEDs with a large size.

An objective of the disclosure is achieved by following embodiments.

An OLED panel comprises a substrate, a cover plate, an organic light-emitting layer arranged between the substrate and the cover plate, a water-blocking layer packing the organic light-emitting layer on a surface of the substrate, and a ring-like composite encapsulating material layer arranged between the substrate and the cover plate, the composite encapsulating material layer surrounds the water-blocking layer, the composite encapsulating material layer and the water-blocking layer are sealed between the substrate and the cover plate, and the composite encapsulating material layer is made of a nano-resin material.

In an embodiment, the composite encapsulating material layer is made of nano light-curing resin.

In an embodiment, the OLED panel further comprises a filling glue filling between the water-blocking layer and the cover plate, and the filling glue is laminated to the composite encapsulating material layer.

In an embodiment, a sidewall of the water-blocking layer is laminated to the composite material layer.

A method for fabricating an OLED panel is provided. The method comprises: providing a substrate and a cover plate; forming a circle of a composite encapsulating material layer made of a nano-resin material on an upper surface of the cover plate; forming an organic light-emitting layer on an upper surface of the substrate; forming at least one water-blocking layer on a surface of the organic light-emitting layer to encapsulation the organic light-emitting layer on the substrate; and laminating the substrate to the cover plate in a vacuum environment to cure the composite encapsulating material layer.

In an embodiment, the method further comprises a step of coating a filling glue on an upper surface of the cover plate and within a region surrounded by the composite encapsulating material layer.

In an embodiment, the water-blocking layer is made of SiNx, SiON, SiOx, or $Al_2O_3$.

In an embodiment, the composite encapsulating material layer is made of nano light-curing resin.

In an embodiment, the composite encapsulating material layer comprises inorganic nano-particles made of $SiO_2$ or $ZrO_2$ and resin matrix, and the inorganic nano-particles are uniformly distributed within the resin matrix.

The present invention uses the nano-resin material with better adhesion and toughness as a encapsulating material of the OLED panel to have compactness and properties of blocking water and oxygen, thereby replacing a dam and a getter and realizing a narrow-bezel encapsulation for OLEDs with a large size.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments. The present disclosure is only to exemplify the present invention but not to limit the scope of the present invention.

Figure 1:
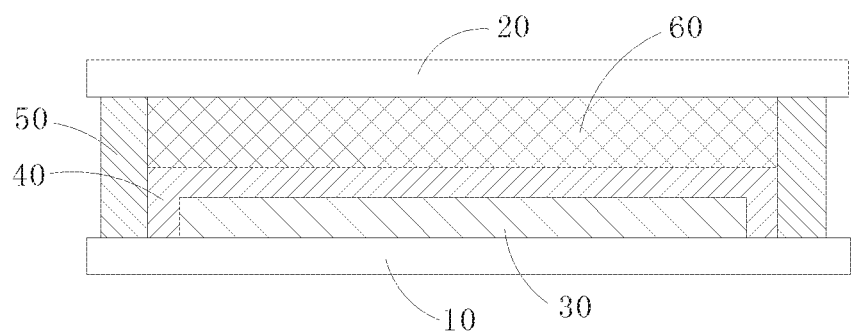
FIG. 1 is a structural schematic view of an OLED panel according to an embodiment of the disclosure.

Refer to FIG. 1. According to an embodiment of the present invention, the OLED panel comprises a substrate 10, a cover plate 20, an organic light-emitting layer 30 arranged between the substrate 10 and the cover plate 20, a water-blocking layer 40 packing the organic light-emitting layer 30 on a surface of the substrate 10, and a ring-like composite encapsulating material layer 50 arranged between the substrate 10 and the cover plate 20, the composite encapsulating material layer 50 surrounds the water-blocking layer 40, the composite encapsulating material layer 50 and the water-blocking layer 40 are sealed between the substrate 10 and the cover plate 20, and the composite encapsulating material layer 50 is made of a nano-resin material.

Here, the composite encapsulating material layer 50 is made of a nano light-curing resin. The composite encapsulating material layer 50 comprises inorganic nano-particles made of $SiO_2$ or $ZrO_2$ and resin matrix, and the inorganic nano-particles are uniformly distributed within the resin matrix. The diameter of the nano-particle is 20-400 nm. The nano light-curing resin is rapidly solidified when ultraviolet light illuminates the nano light-curing resin. The nano light-curing resin has high adhesion, high hardness, and toughness. The nano light-curing resin can be compared with the conventional dam. Since the dam includes glass beads, silicon balls, or plastic particles each having a diameter of 10 um, the main resin matrix cannot achieve the better water-blocking effect. The nano light-curing resin includes many inorganic nano-particles uniformly distributed within the resin matrix to guarantee adhesion and toughness and possess compactness and water-blocking and oxygen-blocking properties of a ceramics. Thus, the nano light-curing resin is used as an OLED encapsulating material to save a dam and a getter to favor realize a narrow-bezel display design, Besides, the OLED panel further comprises a filling glue 60. The filling glue 60 is a transparent optical glue. After curing the filling glue 60, the filling glue 60 can adhere to all the components very well. The filling glue 60 fills between the water-blocking layer 40 and the cover plate 20, and the filling glue 60 is laminated to the composite encapsulating material layer 50. A sidewall of the water-blocking layer 40 is laminated to the composite material layer 50.

Figure 2:
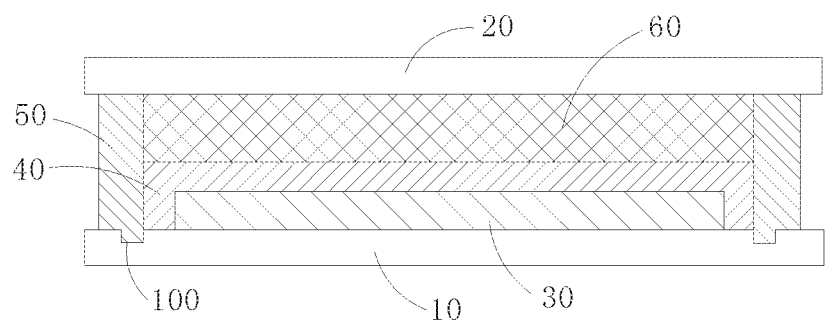
FIG. 2 is a structural schematic view of an OLED panel according to another embodiment of the disclosure.

As shown in FIG. 2, according to the improved embodiment, the surface of the substrate 10 is provided with a groove 100 that is arranged at an outer perimeter of the water-blocking layer 40, and the composite encapsulating material layer 50 fills the groove 100. Preferably, a sidewall of the groove 100 is level with the sidewall of the water-blocking layer 40, such that a contact surface between the substrate 10 the water-blocking layer 40 is like a ladder. The external composite encapsulating material layer 50 can achieve the better encapsulating effect.

Figure 3:
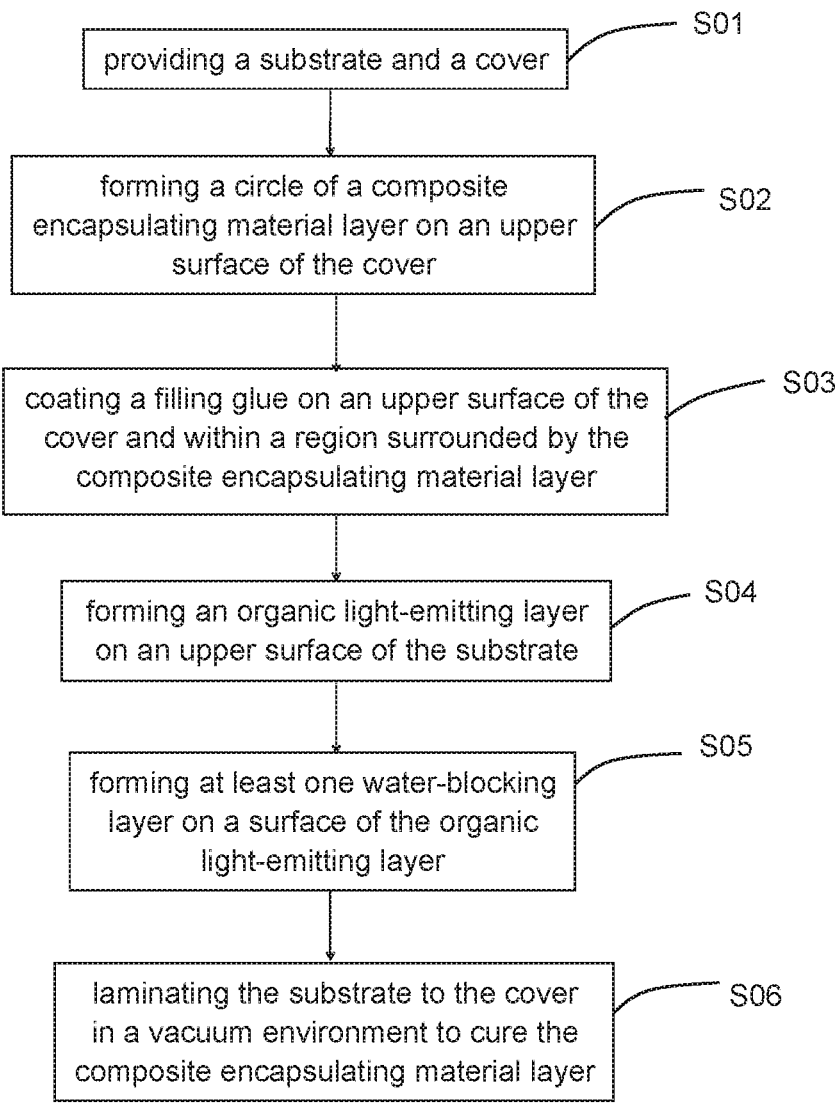
FIG. 3 is a structural schematic view of fabricating an OLED panel according to an embodiment of the disclosure.
Figure 4:
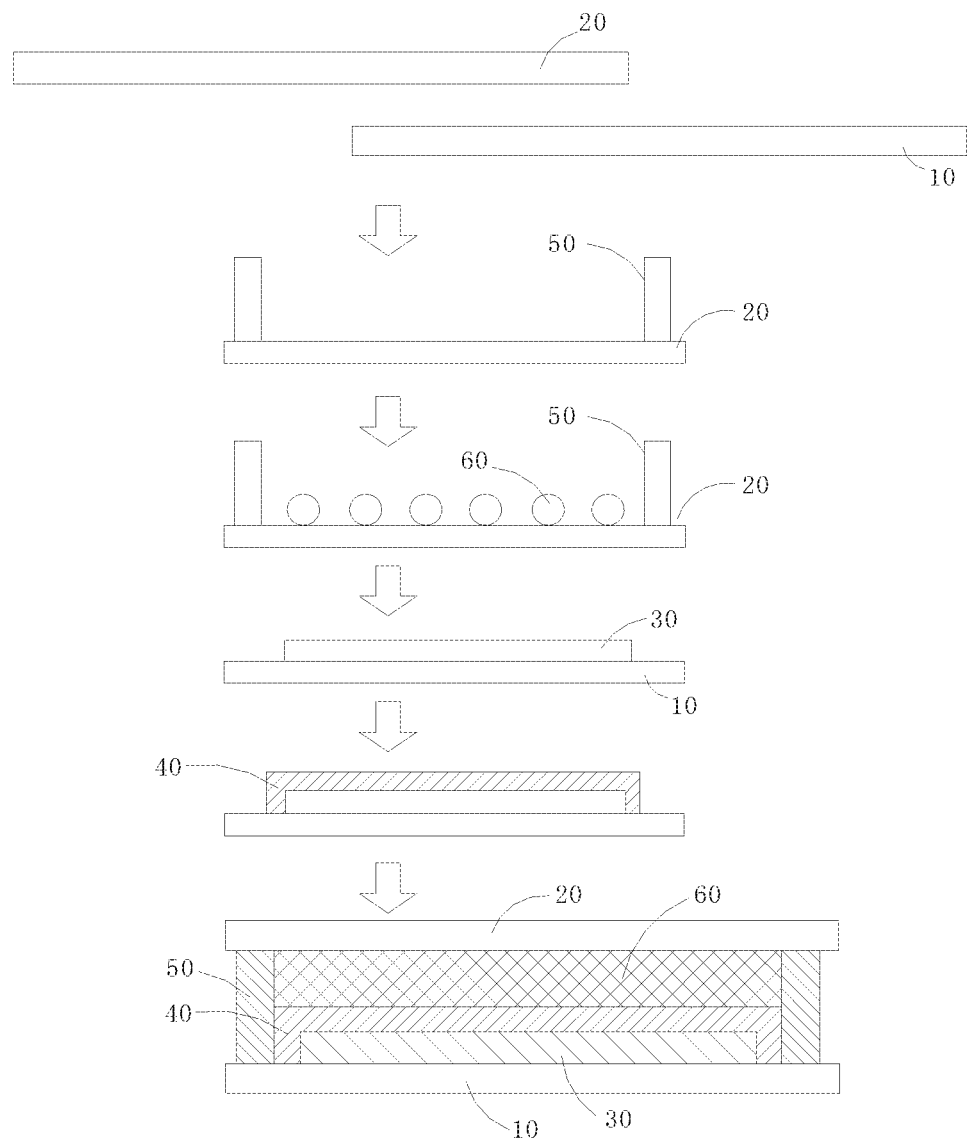
FIG. 4 is a flowchart of fabricating an OLED panel according to an embodiment of the disclosure.

As shown in FIG. 3 and FIG. 4, the present invention also provides a method for fabricating an OLED panel, which comprises:

S01: providing a substrate 10 and a cover plate 20. The substrate 10 is a thin-film transistor (TFT) substrate and the cover plate 20 is a glass cover plate.

S02: coating a circle of a composite encapsulating material layer 50 made of a nano-resin material on an upper surface of the cover plate 20, The composite encapsulating material layer 50 comprises inorganic nano-particles made of $SiO_2$ or $ZrO_2$ and resin matrix, and the inorganic nano-particles are uniformly distributed within the resin matrix. The diameter of the nano-particle is 20-400 nm.

S03: coating a filling glue 60 on an upper surface of the cover plate 20 and within a region surrounded by the composite encapsulating material layer 50. The filling glue 60 is a transparent optical glue. After curing the filling glue 60, the filling glue 60 can adhere to all the components very well.

S04: forming an organic light-emitting layer 30 on an upper surface of the substrate 10.

S05: forming at least one water-blocking layer 40 on a surface of the organic light-emitting layer 30 by plasma-enhanced chemical vapor deposition (PECVD) or plasma-enhanced atomic layer vapor deposition (PEALD) at a low temperature to encapsulation the organic light-emitting layer 30 on the substrate 10, and forming at least one circle of groove 100 arranged at an outer perimeter of the water-blocking layer 40 on an upper surface of the substrate 10.

S06: laminating the substrate 10 to the cover plate 20 in a vacuum environment and using ultraviolet light to illuminate to the composite encapsulating material layer 50 and the filling glue 60 or heating the composite encapsulating material layer 50 and the filling glue 60 to completely cure the composite encapsulating material layer 50 and the filling glue 60, thereby realizing the encapsulation of an OLED panel.

The present invention uses the nano-resin material with better adhesion and toughness as a encapsulating material of the OLED panel to have compactness and properties of blocking water and oxygen, thereby replacing a dam and a getter and realizing a narrow-bezel encapsulation for OLEDs with a large size.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An OLED panel, comprising a substrate, a cover plate, an organic light-emitting layer arranged between the substrate and the cover plate, a water-blocking layer packing the organic light-emitting layer on a surface of the substrate, and a ring-like composite encapsulating material layer arranged between the substrate and the cover plate, the composite encapsulating material layer surrounds the water-blocking layer, and seals the organic light-emitting layer and the water-blocking layer between the substrate and the cover plate, and the composite encapsulating material layer is made of a nano-resin material;

wherein the surface of the substrate is provided with a groove that is arranged at an outer perimeter of the encapsulating layer, and the composite encapsulating material layer fills the groove.

2. The OLED panel according to claim 1, wherein the composite encapsulating material layer is made of nano light-curing resin.

3. The OLED panel according to claim 2, further comprising a filling glue filled between the water-blocking layer and the cover plate, and the filling glue is laminated to the composite encapsulating material layer.

4. The OLED panel according to claim 3, wherein a sidewall of the water-blocking layer is laminated to the composite encapsulating material layer.

5. A method for fabricating an OLED panel, comprising:
providing a substrate and a cover plate;

forming a circle of a composite encapsulating material layer made of a nano-resin material on an upper surface of the cover plate;

forming an organic light-emitting layer on an upper surface of the substrate;

forming at least one water-blocking layer on a surface of the organic light-emitting layer to encapsulate the organic light-emitting layer on the substrate;

laminating the substrate to the cover plate in a vacuum environment and curing the composite encapsulating material layer; and forming at least one circle of groove arranged at an outer perimeter of the encapsulating layer on an upper surface of the substrate before laminating the substrate to the cover plate in the vacuum environment.

6. The method for fabricating the OLED panel according to claim 5, wherein the water-blocking layer is made of SiNx, SiON, SiOx, or $Al_2O_3$.

7. The method for fabricating the OLED panel according to claim 5, further comprising a step of coating a filling glue on an upper surface of the cover plate within a region surrounded by the composite encapsulating material layer.

8. The method for fabricating the OLED panel according to claim 7, wherein the composite encapsulating material layer is made of nano light-curing resin.

9. The method for fabricating the OLED panel according to claim 7, wherein the composite encapsulating material layer comprises inorganic nano-particles made of $SiO_2$ or $ZrO_2$, and resin matrix, the inorganic nano-particles are uniformly distributed within the resin matrix.

* * * * *